United States Patent
Gutheit et al.

[11] Patent Number: 5,855,954
[45] Date of Patent: Jan. 5, 1999

[54] COMPOSITE STRUCTURE FOR MANUFACTURING A MICROELECTRONIC COMPONENT AND A PROCESS FOR MANUFACTURING THE COMPOSITE STRUCTURE

[75] Inventors: Tim Gutheit, Ulm; Reinhard Zachai, Günzburg; Eckart Böttger, Laichingen, all of Germany

[73] Assignee: Daimler-Benz AG, Germany

[21] Appl. No.: 752,263

[22] Filed: Nov. 18, 1996

[30] Foreign Application Priority Data

Nov. 11, 1995 [DE] Germany ............... 195 42 943.5

[51] Int. Cl.$^6$ .................................................. H01L 29/12
[52] U.S. Cl. ........................ 427/249; 427/96; 427/99; 427/122; 427/123
[58] Field of Search ............... 427/249, 96, 99, 427/122, 123

[56] References Cited

U.S. PATENT DOCUMENTS

| | | | |
|---|---|---|---|
| 4,381,201 | 4/1983 | Sakurai | 148/1.5 |
| 5,082,522 | 1/1992 | Purdes et al. | 423/446 |
| 5,087,589 | 2/1992 | Chapman et al. | 437/195 |
| 5,186,785 | 2/1993 | Annamalai | 437/109 |
| 5,391,914 | 2/1995 | Sullivan et al. | 257/77 |
| 5,453,628 | 9/1995 | Hartsell et al. | 338/5 |
| 5,514,603 | 5/1996 | Sato | 437/100 |
| 5,561,303 | 10/1996 | Schrantz et al. | 257/77 |
| 5,683,939 | 11/1997 | Schrantz et al. | 437/195 |

FOREIGN PATENT DOCUMENTS

| | | |
|---|---|---|
| 0 421 397 | 4/1991 | European Pat. Off. . |
| 91/10617 | 1/1993 | WIPO . |

OTHER PUBLICATIONS

"Growth of Textured Diamond Films on Foreign Substrates from Attached Seed Crystals," M.W. Geis, Appl. Phys. Lett. 5 (6), 7 Aug. 1989, pp. 550–552.

*Primary Examiner*—A. A. Turner
*Attorney, Agent, or Firm*—Evenson, McKeown, Edwards & Lenahan, P.L.L.C.

[57] ABSTRACT

The invention provides a composite structure for microelectronic components having a self-supporting metal plate, an electrically insulating layer adhering to the metal plate, and a functional layer adhering to the insulating layer for the application of at least one microelectronic component. An at least largely monocrystalline information layer which covers the metal plate at points is applied to the self-supporting metal plate. The regions of the surface of the metal plate which are free of the information layer are provided with the insulating layer. When the surface of the information layer is exposed at least in regions, the functional layer is deposited on the insulating layer and on the exposed information layer. The crystal information required for an epitaxial deposition of the functional layer is taken from the information layer.

13 Claims, 2 Drawing Sheets

COMPOSITE STRUCTURE FOR MANUFACTURING A MICROELECTRONIC COMPONENT AND A PROCESS FOR MANUFACTURING THE COMPOSITE STRUCTURE

BACKGROUND AND SUMMARY OF THE INVENTION

This invention relates to a composite structure for manufacturing a microelectronic component, and to a process for manufacturing the same.

International patent document WO 93/01617 discloses a composite structure for a microelectronic semiconductor component which has an electric insulating layer made of diamond material, and an insulating layer made of an oxide, which is deposited on and adheres to the structured surface of a growth substrate consisting of silicon. A semiconducting functional layer of a polycrystalline silicon is arranged on the diamond insulating layer. In a generally known manner, the whole composite structure is provided for the construction of a microelectronic component. The diamond insulating layer has, among others, the advantage that it has a good thermal conductivity, so that it carries away dissipative heat generated during the operation of the semiconductor component. As a result, devices for converting high power can be manufactured.

However, the depositing of the insulating layer always stresses the layers situated underneath, among others, from a thermal and/or mechanical point of view. Furthermore, because of the difficulty of structuring the diamond layer, such a composite structure is not fully suitable for combining logic and power components on a carrier (chip). Also, because of the required thick layers, the manufacturing of vertically constructed components is at least made more difficult.

Based on this state of the art, it is an object of the present invention to provide an improved composite structure, and a corresponding manufacturing process, which eliminate the above-mentioned disadvantages, and facilitate the manufacturing of corresponding components.

This and other objects are achieved by the composite structure and process according to the invention, by intensive growth of the insulating layer on a metal plate formed primarily of CuMo, Mo or Al, so that only the information layer, which is used as the nucleus for a functional layer, is stressed, and at most there will be a slight stressing of the metal plate.

In principle, the application of the information layer to the metal plate can take place before, during or after the arrangement of the insulating layer, in which case regions of one of the layers must be removed again after its deposition. For process reasons, it is advantageous to apply the information layer before the arrangement of the insulating layer, which simplifies the manufacturing. Since the component roots of the electronic components are at least largely arranged above those regions of the insulating layer which have no information layer, this has little or no effect on the quality of the component.

The crystal information required for the epitaxy of the functional layer deposited above the insulating layer is taken from the information layer, being transferred to the functional layer from the information layer. This measure achieves a composite having a structure which is suitable for the manufacture of the components which combine logic and power devices on a common chip, at least in regions on the metal plate. In this case, it is particularly advantageous that, as a result of the metal plate, the composite structure has good heat dissipation properties. Furthermore, the composite structure also has a high mechanical stability.

In addition, by using an information layer for the epitaxy, it is also possible to arrange the functional layer, and also the other layers, if desired, with a small layer thickness so that the composite structure is readily suitable also for the implementation of components constructed of vertically arranged layers; that is, layers which are sandwiched above one another.

Furthermore, such a composite structure or such a microelectronic component has a high mechanical stability, because the self-supporting and heat-dissipating metal plates, among other things, at the same time, act in a mechanically stabilizing manner.

It is another advantage that, without consideration of other layers, the insulating layer can be freely structured, and can thus be provided with an arbitrary topology.

Other objects, advantages and novel features of the present invention will become apparent from the following detailed description of the invention when considered in conjunction with the accompanying drawings.

DETAILED DESCRIPTION OF THE DRAWINGS

Figure 1:
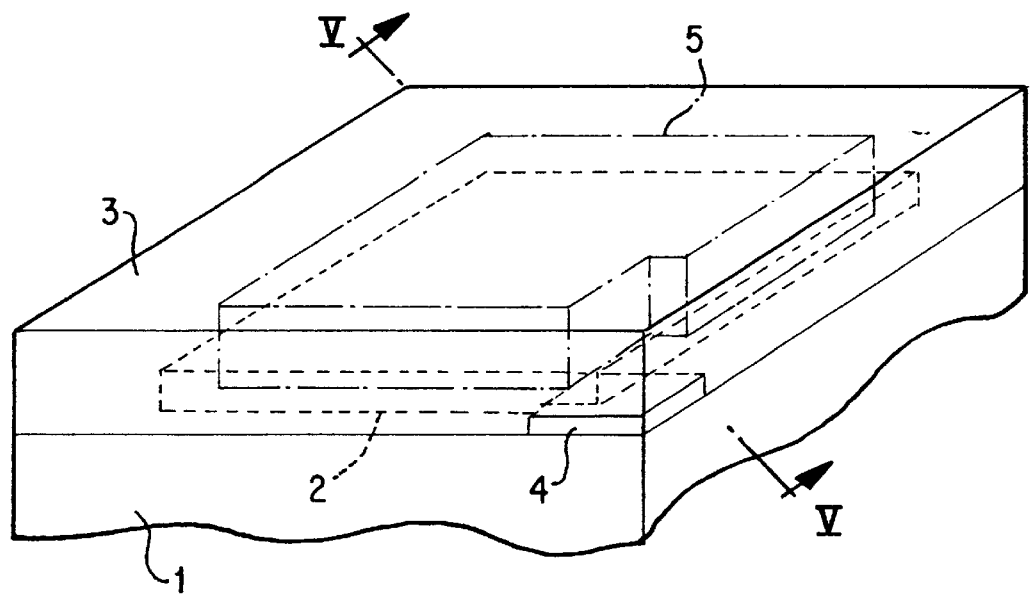
FIG. 1 is a perspective representation of a composite structure according to the invention, with a possible region for arranging a component root of a microelectronic component.

FIG. 1 illustrates a composite structure according to the invention, which is provided for the application of microelectronic components, such as diodes, transistors, (bipolar, field effect, etc.), amplifiers and the like. The composite structure has a self-supporting metal plate 1, an insulating layer 2 which is arranged on and adheres directly to the metal plate, and insulates electrically, and a functional layer 3 that adheres directly to the insulating layer 2, which is a good conductor of heat. An information layer 4 is arranged on a corner of the metal plate 1. A portion of the information layer 4 (which is made primarily of monocrystalline silicon) is covered by the insulating layer 2, while the functional layer 3 covers the information layer completely. The microelectronic component is then produced by means of the functional layer 3. In this case, the component root 5 (that is, the region of the component which faces the functional layer 3) is suitably arranged in the portion of the functional layer 3 which is constructed as a semiconductor layer, and which is situated above the metal plate 1 without the information layer. This arrangement is advantageous because the dissipative heat generated in the operation of the component can flow directly from the functional layer 3 into the metal plate 1, by way of the electric insulating layer 2 (which is advantageously made of polycrystalline diamond material and/or of a polycrystalline diamond-like material).

Figure 2:
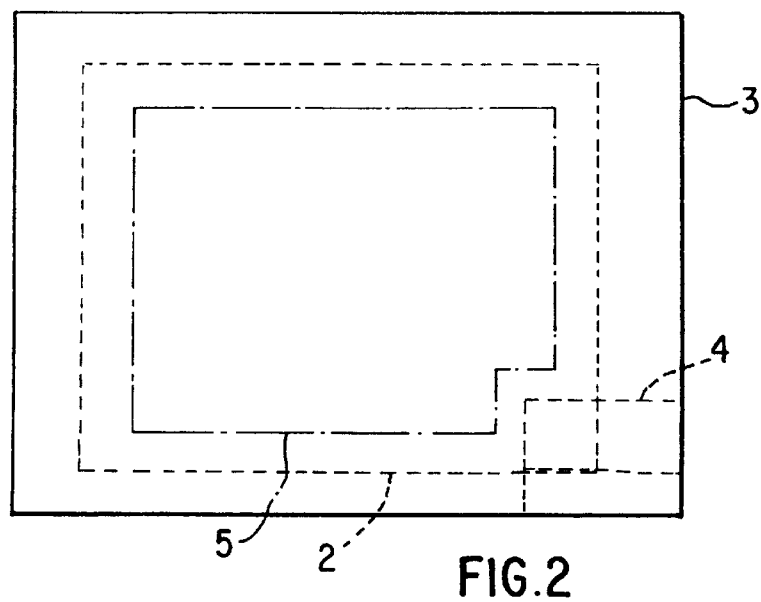
FIG. 2 is a top view of the composite structure according to FIG. 1.

FIG. 2 is a top view of the composite structure according to FIG. 1, in which the individual surfaces of the respective layers (being, as mentioned, covered by the functional layer 3), are indicated by different types of lines. Specifically, the functional layer 3 is indicated by a solid line, the diamond insulating layer 2 is indicated by a dotted line; the information layer 4 of a monocrystalline silicon is indicated by a broken line; and the component root 5 is indicated by a dash-dotted line. This representation shows clearly that the information layer 4 is partially covered by the insulating layer 2; that the functional layer 3 completely covers the insulating layer 2 and the information layer 4; and that the component root 5 is arranged outside the information layer 4.

The process for manufacturing a composite structure according to FIG. 1 will be described in the following by means of FIGS. 3, 4 and 5, which show the composite structure following each of the process steps according to the invention, the composite structure being cut along line V—V, which corresponds approximately to a diagonal line of the four-cornered metal plate.

In order to avoid unnecessary repetitions of process steps which are known per se with respect to the epitaxy of semiconductors and of the electrolytic deposition, in the description of the process according to the invention, sufficiently well known process steps (such as polishing, cleaning the respective free surfaces, etc.), will be left out because they are known to the person skilled in the art.

Figure 3:
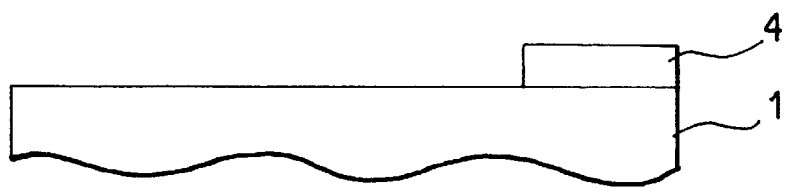
FIG. 3 is a view of a self-supporting metal plate with an information layer arranged thereon.

FIG. 3 illustrates a self-supporting metal plate 1, with the information layer 4 glued and/or bonded in the area of a corner thereof.

Figure 4:
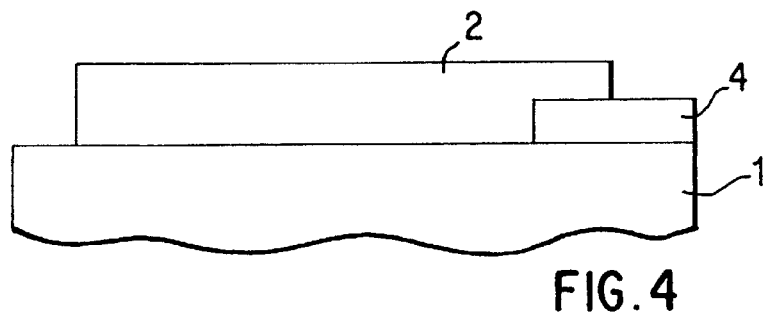
FIG. 4 is a view of a structure according to FIG. 3 with an insulating layer arranged thereon.

FIG. 4 shows the metal plate 1 and information layer 4 according to FIG. 3, on which a polycrystalline diamond layer is deposited as the insulating layer 2, by means of plasma CVD (chemical vapor deposition) in a manner that is known per se. The insulating layer 2 is deposited, for example, by means of the mask technique known from semiconductor production, while only partially covering the information layer 4. Alternatively, can be deposited over the whole free surface of the information layer 4, which is thereafter exposed again, at least in regions, for example, by means of a selective etching known from semiconductor production. The materials, substances and process used for this purpose, are well known to those skilled in the art.

According to another higher-expenditure alternative, in contrast to the process steps illustrated in FIGS. 3 and 4, the insulating layer 2 may also first be deposited, for example, over the whole surface of the metal plate, and can then be partially removed. The information layer 4 can then be arranged in the region of the removed insulating layer 2.

In all cases, the insulating layer 2 will later be used for at least partial electric insulation of the functional layer 3 with respect to the metal plate 1, and for a good thermal contact between the metal plate 1 and the functional layer 3.

Figure 5:
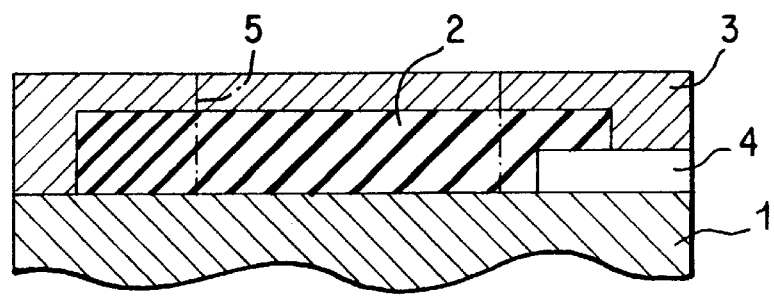
FIG. 5 is a sectional view along Line V—V of the composite structure according to FIG. 1, which corresponds to a structure according to FIG. 4 with a functional layer arranged thereon.

FIG. 5 is a sectional view of the composite structure according to FIG. 1 along Line V—V. FIG. 5 shows the metal plate 1 according to FIG. 4 provided with the information layer 4 and the insulating layer 2, which are completely covered by the functional layer 3 made of a crystalline semiconductor material.

The functional layer 3 is preferably deposited by means of a known suitable process, preferably gas phase epitaxy. The crystal information required for the epitaxial deposition of the functional layer 3 is taken from the monocrystalline information layer 4. To permit this information flow, the information layer 4 has a free surface at the start of the deposition with respect to the depositing gas phase from which the functional layer 3 is deposited. When the information layer 4 consists of the same material as the functional layer 3, this is a homoepitaxial deposition with respect to these two layers. If the functional layer 3 is formed from a material other than that of the information layer 4 (for example, the information layer 4 is monocrystalline silicon and the functional layer 3 is made of a different crystalline semiconductor material), this would be a heteroepitaxial deposition or a heteroepitaxy with respect to these two layers.

To improve the quality of the functional layer 3, it is then crystallized by heating, in a known manner, advantageously, by guiding a heating wire over the surface of the functional layer 3. As a result, the functional layer 3 will be heated from the top. The movement of the heating wire expediently starts above the area in which the information layer 4 directly contacts the functional layer 3, and is continued from there without interruption and in a surface-covering manner. Following this step, the application of a microelectronic component can start in the known manner.

Figure 6:
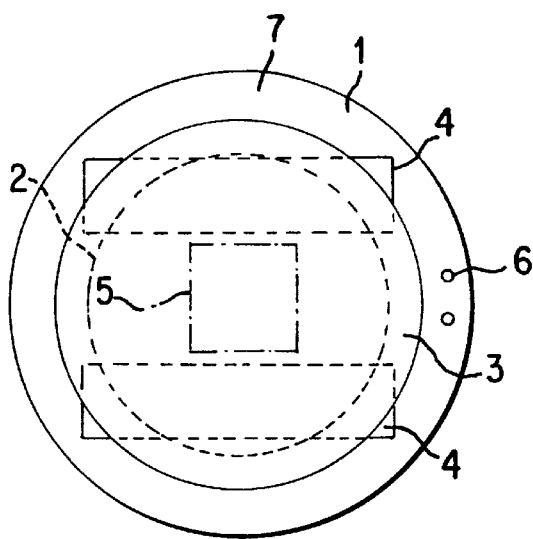
FIG. 6 is a top view of another composite structure with a differently arranged information layers.
Figure 7:
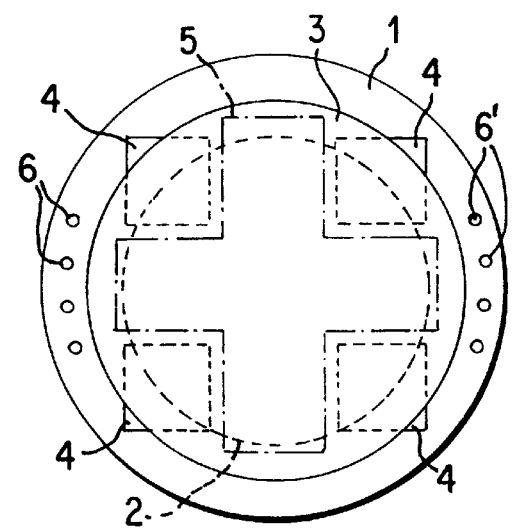
FIG. 7 is a top view of another composite structure with information layers which are arranged differently again.

FIGS. 6 and 7 are each tops views of other composite structures which, in contrast to the embodiment of the preceding figures, have information layers 4 which are arranged differently on the metal plate 1. The different layers (metal plate 1, information layer 4, insulating layer 2, functional layer 3 and component root 5) in these Figures are indicated by the same type of line used in FIG. 2 for the corresponding layer.

FIG. 6 illustrates a composite structure with a round metal plate 1 with a diameter of six inches, which corresponds to the 6-inch silicon wafers customary in semiconductor production. Two strip-shaped information layers 4 made of monocrystalline silicon are arranged in parallel to a diameter of the metal plate 1, and are glued onto it on the edge side. The insulating layer 2 made of a diamond material and/or a diamond-like material is deposited on the information layers 4 and the metal plate 1, a circular-ring-shaped strip remaining free on the periphery in the case of the metal plate 1. The two information layers 4 also have a free surface in the region of this circular ring. Above the insulating layer 2, the function layer 3 completely covers the insulating layer 2. Within another, smaller, circular contact ring 7 remaining on the periphery, the information layers 4 and the metal plate 1 have a free surface. The approximately rectangular component root 5 is arranged essentially in the region which, for the most part, is situated outside the layer sequence of the composite structure having the information layer 4.

FIG. 7 illustrates still another composite structure, which also includes a round metal plate 1. The diameter of the metal plate 1 also measures six inches. Four square information layers 4 made of monocrystalline indium phosphide (InP) are arranged on the metal plate 1 along the periphery, directly contacting and adhering to the metal plate 1. The insulating layer 2 made of the diamond material and/or diamond-like material is deposited on the information layers 4 and the metal plate 1, with a circular-ring-shaped strip remaining free on the periphery of the metal plate 1. In the region of this circular ring, the four information layers 4 also have a free surface. Above the insulating layer 2, the functional layer 3 is arranged which is, for example, formed of indium gallium arsenide (InGaAs) or of indium gallium arsenide phosphide (InGaAsP), which covers the insulating layer 2 completely.

Within the remaining peripheral circular contact ring 7, the metal plate 1 and the information layers 4 still have a free surface which can be used to contact the component whose component root 5 is arranged completely outside the layer sequence of the composite structure having the information layers 4. Such connections 6 and 6' are illustrated in FIG. 7 on the right and left sides of the contact ring 7. The right-side connections 6 are connected with the metal plate 1 in an electrically conductive manner. In contrast, the left-side connections 6' are electrically insulating with respect to the metal plate 1. By means of the electrically conductive connections 6, for example, a gate can be constructed in a simple manner by means of the metal plate 1.

Generally, it is also possible in this manner to contact the functional layer 3 or an arbitrary layer of the microelectronic component with the metal plate 1 in an electrically conductive manner. In this case, the contacting is advantageously achieved by selectively removing the corresponding intermediate layers (for example, the insulating layer 2 and/or the information layer 4) which are situated underneath and which separate the layer to be contacted from the metal plate 1, before the depositing of the layer to be contacted. In this manner, the layer to be contacted is deposited directly on the metal plate 1 in the region of the removed intermediate layers.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Process for manufacturing a multi-layer composite structure, in which an electrically isolating insulating diamond layer comprising one of a diamond material and a diamond-like carbon material is deposited on a metallic layer, with a functional layer comprising a crystalline semiconductor material arranged on the diamond layer, for the later application of at least one microelectronic component, said process comprising the steps of:

providing a self-supporting metal plate as a metallic layer;

applying to the metal plate an at least largely monocrystalline information layer which covers at least one area of the metal plate;

applying a polycrystalline diamond insulating layer at least to regions of the surface of the metal plate which are outside of the at least one area covered by the information layer, at least regions of a surface of the information layer being left free; and depositing a functional layer which is free of diamond and free of diamond-like carbon directly on the diamond layer and on free regions of the information layer by means of epitaxial deposition according to crystal information from the information layer.

2. Process according to claim 1, wherein at least one of the diamond layer and the functional layer is deposited by means of a chemical vapor deposition process.

3. Process according to claim 2, wherein said chemical vapor deposition process is a plasma chemical vapor deposition process.

4. Process according to claim 1, wherein the information layer is attached to the metal plate by one of gluing and bonding.

5. Process according to claim 1, wherein the functional layer and the information layer are deposited heteroepitaxially on one another.

6. Process according to claim 1, wherein the functional layer is recrystallized after its deposition.

7. Process according to claim 1, wherein the functional layer is thermally recrystallized after its deposition.

8. Process according to claim 1, wherein the functional layer is heated from a direction of the surface and is recrystallized.

9. Process according to claim 1, wherein the functional layer is heated and recrystallized on a surface thereof, the heating starting above a directly contacting region of the information layer and progressing from there without interruption in a surface-covering manner.

10. Process according to claim 1, wherein the diamond layer is also deposited on the information layer, and the information layer is at least in regions exposed again before the deposition of the functional layer.

11. Process for manufacturing a microelectronic component arrangement comprising a functional layer which contains a microelectronic component, and an electrically insulating layer, said arrangement having a self supporting metal plate, an insulating layer deposited on the self-supporting metal plate, by means of at least one of chemical vapor deposition from a gas phase, and electrolytically, and an electrically insulating layer which is a good conductor of heat arranged between the metal plate and the functional layer, said insulating layer contacting and adhering directly to the metal plate and with the functional layer, said process comprising the steps of:

providing a self-supporting metal plate as a metallic layer;

applying to the metal plate an at least largely monocrystalline information layer which covers at least an area of the metal plate;

applying a polycrystalline diamond insulating layer at least to regions of the surface of the metal plate which are outside of the at least one area covered by the information layer, at least regions of a surface of the information layer being left free; and depositing a functional layer which is free of diamond and free of diamond-like carbon directly on the diamond layer and on the free information layer, by means of epitaxial deposition according to crystal information from the information layer; wherein the microelectronic component is applied via the functional layer; and a component root of the microelectronic component, comprising a surface covered by the microelectronic component on at least the functional layer, is arranged at least in regions above at least one of the functional layer and the insulating layer, which regions are free of the information layer.

12. Process according to claim 11, wherein electric connections of the component are arranged in an electrically insulating manner on the metal plate for external contact.

13. Process according to claim 11, wherein electric connections 6' of the component are contacted on the metal plate in an electrically conductive manner.

* * * * *